(12) United States Patent
Bitz et al.

(10) Patent No.: US 8,994,372 B2
(45) Date of Patent: Mar. 31, 2015

(54) MAGNETIC RESONANCE IMAGING APPARATUS, EVALUATION DEVICE, AND METHOD

(75) Inventors: Andreas Bitz, Wuppertal (DE); Stefan Maderwald, Essen (DE); Stephan Orzada, Moers (DE); Benedikt Poser, Heikendorf (DE)

(73) Assignee: Siemens Aktiengesellschaft, Munich (DE)

( * ) Notice: Subject to any disclaimer, the term of this patent is extended or adjusted under 35 U.S.C. 154(b) by 339 days.

(21) Appl. No.: 13/039,545

(22) Filed: Mar. 3, 2011

(65) Prior Publication Data

US 2011/0215803 A1    Sep. 8, 2011

(30) Foreign Application Priority Data

Mar. 3, 2010   (DE) .......................... 10 2010 010 183
Mar. 18, 2010  (DE) .......................... 10 2010 011 968

(51) Int. Cl.
G01R 33/44     (2006.01)
G01R 33/561    (2006.01)
G01R 33/565    (2006.01)

(52) U.S. Cl.
CPC ........ *G01R 33/5612* (2013.01); *G01R 33/5659* (2013.01)
USPC ...................................................... 324/307

(58) Field of Classification Search
CPC ..................... G01R 33/5612; G01R 33/5659
USPC .................................. 324/307, 309; 600/410
See application file for complete search history.

(56) References Cited

U.S. PATENT DOCUMENTS

| | | | | |
|---|---|---|---|---|
| 5,578,924 A * | 11/1996 | Dumoulin et al. | ............ | 324/309 |
| 5,910,728 A | 6/1999 | Sodickson | | |
| 6,326,786 B1 | 12/2001 | Pruessmann et al. | | |
| 6,573,714 B1 * | 6/2003 | Hu et al. | ........................ | 324/300 |
| 6,734,673 B2 | 5/2004 | Agrikola | | |
| 6,900,636 B2 | 5/2005 | Leussler | | |
| 7,218,113 B2 | 5/2007 | Feiweier et al. | | |
| 7,495,437 B2 | 2/2009 | Griswold et al. | | |
| 7,615,997 B2 * | 11/2009 | Graesslin et al. | ............. | 324/314 |
| 7,898,252 B2 * | 3/2011 | Crozier et al. | ................ | 324/307 |
| 8,334,692 B2 * | 12/2012 | Harvey et al. | ................ | 324/307 |
| 2004/0155656 A1 * | 8/2004 | Leussler | ........................ | 324/318 |
| 2007/0013374 A1 | 1/2007 | Griswold et al. | | |
| 2007/0285094 A1 * | 12/2007 | Reeder et al. | ................. | 324/313 |
| 2008/0272785 A1 * | 11/2008 | Crozier et al. | ................ | 324/318 |
| 2009/0072827 A1 * | 3/2009 | Hargreaves | ................... | 324/309 |
| 2009/0137897 A1 * | 5/2009 | Balchandani et al. | ........ | 600/410 |
| 2009/0212773 A1 * | 8/2009 | Feinberg et al. | ............. | 324/309 |
| 2009/0292197 A1 | 11/2009 | Fuderer | | |
| 2009/0309594 A1 | 12/2009 | Feiweier et al. | | |

(Continued)

OTHER PUBLICATIONS

Bitz et al., "An 8-channel add-on RF shimming system for whole-body 7 Tesla MRI including real-time SAR monitoring," Apr. 2009, ISMRM, 17th Scientific Meeting and Exhibition, p. 4767.*

(Continued)

*Primary Examiner* — Melissa Koval
*Assistant Examiner* — Rishi Patel
(74) *Attorney, Agent, or Firm* — Schiff Hardin LLP (57) ABSTRACT

An image is generated from data acquired with a magnetic resonance tomography, wherein nuclear spins in an excitation region are excited with different transmission modes and a common image is generated from the response signals.

20 Claims, 4 Drawing Sheets

(56) References Cited

U.S. PATENT DOCUMENTS

| | | | |
|---|---|---|---|
| 2010/0239142 A1* | 9/2010 | Dannels et al. | 382/131 |
| 2010/0301859 A1 | 12/2010 | Boulant | |
| 2011/0260726 A1* | 10/2011 | Techavipoo et al. | 324/309 |

OTHER PUBLICATIONS

Katscher et al. "Transmit SENSE," Dec. 31, 2002, Magnetic Resonance in Medicine, vol. 49, Issue 1, pp. 144-150.*

Orzada, Stephan et al., "RF Excitation Using Time Interleaved Acquisition of Modes (TIAMO) to Address B1 Inhomogeneity in High-Field MRI" Jun. 22, 2010, MRM, vol. 64, Issue 2, pp. 327-333.*

Orzada, S., Maderwald, S., Poser, B. A., Bitz, A. K., Quick, H. H. and Ladd, M. E. (2010), RF excitation using time interleaved acquisition of modes (TIAMO) to address B1 inhomogeneity in high-field MRI. Magn Reson Med, 64: 327-333. doi: 10.1002/mrm.22527.*

Katscher et al. "Improving RF Shimming via Non-Linear Sub-Image Combination," Proc. Intl. Soc. Mag. Reson. Med., vol. 18 (2010) p. 4919.

* cited by examiner

MAGNETIC RESONANCE IMAGING APPARATUS, EVALUATION DEVICE, AND METHOD

BACKGROUND OF THE INVENTION

1. Field of the Invention

The present invention concerns a method to generate an image with a magnetic resonance tomography apparatus and an evaluation device, as well as a magnetic resonance tomography apparatus.

2. Description of the Prior Art

Magnetic resonance tomography (abbreviated as MRT) has for many years represented one of the central imaging methods of biophysics and medicine.

MRT is based on the alignment of nuclear spins (in particular that of H atoms) in a body by means of a strong, stationary magnetic field (also called a B0 field or basic magnetic field). The nuclear spins can be deflected out of their alignment or can be affected in their alignment by energy supplied to them at a specific resonance frequency (known as the Larmor frequency) dependent on an external magnetic field (such as the B0 field).

Excited spins release energy again and generate a measurable field or response signal. The response signal emitted by the nuclear spins is detected and used for image generation.

Individual aspects of MRT according to the present invention are first discussed in detail.

a) Excitation

A number of nuclear spins are excited simultaneously. The region of a body in which nuclear spins are excited or can be excited simultaneously is designated as an "excitation region". An excitation region is thus a region with essentially the same Larmor frequency. In order to establish or demarcate the excitation region or a sub-region to be evaluated—for example to a slice of a body to be examined—or in order to enable an association of the response signal to a spatial region (such as what is known as a voxel), a spatially-dependent coding takes place by spatially dependent shaping of the magnetic field (and therefore of the Larmor frequency), by the application or superimposition of gradient fields.

The excitation of nuclear spins takes place by supplying energy, in particular by an electrical signal or radio-frequency signal, a magnetic and/or (radio-frequency) alternating field, B1 field, external magnetic field and/or a corresponding pulse (called an "excitation signal" in the following). The excitation signal advantageously has components at the Larmor frequency.

In practice a pulse-like excitation of the nuclear spins preferably takes place, in particular with an excitation pulse. In the following an excitation signal that has a pulse-shaped curve, in particular at least one region with rising and/or falling intensity or amplitude, is designated in the following as an "excitation pulse".

The excitation signal is advantageously generated by superimposing multiple transmission signals of different transmission devices or antennas that can form transmission channels. Particularly at higher frequencies, shadows, interferences and/or inhomogeneities occur, particularly with regard to the spatial field strength distribution. This spatial distribution of the excitation signal is designated according to the invention as a "transmission characteristic". The inhomogeneity of the transmission characteristic of an excitation signal is relevant in excitation region. The transmission characteristic also depends on properties of the surrounding medium, such as the body to be examined or the like.

b) Acquisition

Components or portions of a response signal are also designated as an "acquisition signal". A response signal can thus have multiple acquisition signals or be composed of these.

A response signal is advantageously acquired by means of an acquisition device. Different acquisition signals are particularly preferably acquired or, respectively, measured via multiple acquisition devices (such as acquisition coils or the acquisition device) that can also form acquisition channels.

c) Measurement Sequence and Imaging

In order to also achieve a resolution in the coding or spatial directions, a measurement process—namely excitation with specific coding and acquisition of a response signal—is implemented multiple times repeatedly with different codings. Such a sequence of multiple measurement processes is designated as a "measurement sequence". In particular, a measurement sequence is a series of multiple measurement processes to generate an image with resolution in a phase coding direction.

In the present invention the response signals or their acquisition signals of the measurement processes or measurement sequences are advantageously stored or saved in at least one measurement matrix (also henceforth called a matrix), in particular line by line.

In each measurement process a response signal associated with this is advantageously determined. From the respective response signal a corresponding matrix line of a measurement matrix can be generated with regard to a measurement process, wherein the response signal associated with a measurement process is advantageously split up into spectral portions. The spectral portions can be respectively associated with a matrix element such that a line of the measurement matrix arises with regard to a matrix element or a response signal. In this way a measurement matrix can be successively filled with a measurement sequence.

To generate the image, the measurement matrix that is generated in such a manner is advantageously converted into an image using a Fourier transformation or another evaluation or analysis method. An image of the excitation region (such as a slice of the body to be examined) can be generated from a measurement matrix. This can have a brightness distribution that enables conclusions about the spatially-related properties of the slice, in particular with regard to the spatially-related number of H atoms, information about the chemical composition or the like. Multiple images or slice exposures of different excitation regions are possible with multiple measurement sequences.

For a 3D MRT method, analogous to the described procedure not just one very thin slice but a somewhat thicker slice or an excitation region with a certain extent in the z-direction can be excited transversal to the slice plane, in particular via an excitation signal or an excitation pulse with a corresponding bandwidth. A three-dimensional image can be generated via corresponding coding and evaluation, advantageously again with matrices (in particular multiple and/or three-dimensional matrices).

Measurement matrices and their matrix cells merely represent preferred means of representation for illustration and/or in particular mathematical and/or computational processing. The following explanations using matrices are therefore merely examples. The use of matrices does not represent a requirement for the method according to the invention, although evaluations, analyses and/or image generation are preferably implemented on the basis of matrices. Matrices enable the method necessary to generate an image to be applied in a structured and comprehensible manner. However, the present invention can also be realized with other known and future methods or representations to generate an image from response signals.

d) Image Generation at High Magnetic Field Strengths

In the presently available MRT methods the homogeneity or uniformity of the excitation is essential to the ability to interpret the image. A non-uniform excitation of the excitation region or more or less excited or, respectively, shadowed sub-regions in the excitation region lead to a non-uniform brightness distribution or even to incorrect information in the resulting image.

In order to achieve a high resolution and/or good contrasts, the use of an optimally strong magnetic field is advantageous. The Larmor frequency also simultaneously increases with an increase of the magnetic field strength. Therefore an excitation signal of correspondingly higher frequency must be used to excite the nuclear spins.

Primary magnetic resonance tomographs with magnetic field strengths between 0.5 T and 3 T are currently used. At high field strengths in the sense of the present invention, thus field strengths that are advantageously above 3 T (for example 7T), the Larmor frequency is so high that it increasingly leads to diffraction effects and/or shadows in the body to be examined. In particular, this leads to diffraction effects and distortions of the transmission characteristic. This results in a non-uniform and/or insufficient excitation of the nuclear spins in the excitation region. Therefore different methods (in part very complicated methods) have been developed in order to achieve an optimally homogeneous excitation of a slice or, respectively, of the excitation region, in particular even given use of higher magnetic field strengths.

Methods to homogenize fields to excite nuclear spins today operate most often with transmission devices with multiple transmission units (such as antennas or coils) that can be operated independent of one another, thus with multiple (independent) channels. Channels can be associated with both transmission and acquisition devices. Therefore differentiation is also made in the following between transmission channels that advantageously correspond to transmission devices and acquisition channels that advantageously correspond to acquisition devices. Since it is possible to also use transmission devices as acquisition devices and vice versa, it is possible that multiple channels—in particular one transmission channel and one acquisition channel—can be associated with a transmission and/or acquisition device. Methods with multiple transmission devices or, respectively, multiple transmission channels that can be operated independent of one another are also called multichannel transmission methods. Methods with acquisition devices with multiple acquisition units are henceforth accordingly called multichannel acquisition devices.

In the case of multichannel transmission methods, the excitation signal advantageously consists of multiple transmission signals that are in particular associated with transmission devices or channels. Given multichannel acquisition methods, the response signal can have multiple acquisition signals that in particular are associated with acquisition devices or channels.

In a multichannel transmission method known from DE 101 24 465 A1 (corresponding to U.S. Pat. No. 6,900,636) from which the present invention arises, amplitude and phase positions of different transmission signals or, respectively, for different transmission devices are preset in a fixed manner such that an optimally homogeneous transmission characteristic—thus an optimally homogeneous B1 field—is achieved. The corresponding adaptation of the transmission signals is also called "radio-frequency shimming" or "RF shimming".

However, given the use of high magnetic field strengths the method is in particular not in the position to sufficiently reduce shadows.

In another multichannel transmission method (for example that known from DE 10 2004 002 009 A1, corresponding to U.S. Pat. No. 7,218,113) it is sought to affect the transmission characteristic via transmission signals with pre-distorted and temporally variable pulse shapes so that a homogeneous excitation of the excitation region is achieved. These methods are also called "Transmit Sensitivity Encoding" or "Transmit SENSE" but are significantly more complicated in comparison to RF shimming. A separate, more complex pulse generator that supports a variation of amplitude and phase in the time curve of the pulse is required for each transmission device or, respectively, each transmission signal. A similarly complicated determination of the properties of each individual transmission device in advance of each measurement is required for calibration, which leads to time losses in the measurement.

A method known from DE 10 2005 018 937 A1 (corresponding to United States Publication No. 2007/0013374) addresses the calculation of calibration coefficients for Transmit SENSE, wherein individual coils of a transmission coil array are activated individually and corresponding response signals are acquired simultaneously by means of multiple methods. The known method does not address an image generation with multiple transmission modes, nor is the large system cost to implement Transmit SENSE reduced.

WO 2009/053770 A1 (corresponding to United States Publication No. 2010/0301856) discloses a transmission method that resembles Transmit SENSE. However, in contrast to Transmit SENSE constant phases and amplitudes are used at least in certain time segments, which should reduce the complexity of the system.

DE 10 2005 039 686 B3 (corresponding to United States Publication No. 2009/0309594) describes a method to improve contrasts of MRT images. Fields are used that are advantageously right-polarized since this abets the transfer of energy to the spins. In particular at high Larmor frequencies, the acquisition of left- and right-polarized fields takes place since both polarization types can contain information due to distortion effects. However, shadows can also not be effectively prevented or compensated with this method.

An additional limiting factor in MRT is the acquisition time necessary to achieve high-resolution images. In order to optimally reduce the residence time of a body to be examined (such as that of a person) while maintaining resolution and maintaining contrasts, methods have been proposed for partial parallel acquisition (henceforth abbreviated as PPA), wherein additional information from multiple acquisition channels or, respectively, acquisition signals that are independent of one another are used. In this way it is possible to omit measurement processes and to reconstruct the image on the basis of this independent information of multiple acquisition channels in order to achieve the same resolution—in particular in the direction of the time-consuming phase coding (in what is known as k-space)—with a reduced number of measurement processes and accordingly in a shorter amount of time per measurement sequence.

WO 2008/004192 A2 (corresponding to United States Publication No. 2009/0292197) discloses a method to accelerate the acquisition of MRT data in a PPA measurement sequence, wherein a characterization of the transmission units is necessary to process the acquisition signals. The goal of the described method is to reduce the correction cost and the cost to determine corresponding correction data in that a reduced resolution is used for a reference measurement.

DE 10 2005 018 814 A1 (corresponding to U.S. Pat. No. 7,495,437) provides a determination of a special construction matrix by means of which a processing of incompletely acquired data sets or measurement matrices can take place. The computing cost to generate an image under the described requirements should be reduced in this manner.

DE 101 44 654 A1 (corresponding to U.S. Pat. No. 6,734,673) proposes a reconstruction of unacquired lines of a measurement matrix using a sensitivity function for individual acquisition directions or channels, wherein this is described by Fourier series.

From the prior art, at present only Transmit SENSE or its modifications are in the position to effectively reduce or avoid a shadow image given the use of high magnetic field strengths (such as 7 T). Conversely, complicated and expensive devices as well as complex signal processings are required to implement such methods.

SUMMARY OF THE INVENTION

An object of the present invention is to provide a method, an evaluation device and a magnetic resonance tomography apparatus with which inhomogeneities that occur in the excitation signal can be compensated in a particularly simple, cost-effective and/or effective manner, and/or a shadow image and inhomogeneities in the generated image can be reduced, avoided or compensated in a particularly simple, cost-effective and/or effective manner even given the use of high magnetic field strengths.

According to the invention, to generate an image with a magnetic resonance tomograph nuclear spins in an excitation region of a body to be examined are excited in a first transmission mode and a first response signal associated with the first transmission mode is acquired from the excitation region. Nuclear spins in the excitation region are additionally excited at least one second time and using a second transmission mode that is different than the first. A second response signal associated with the second transmission mode is acquired from the excitation region and a common image is generated using the first and second response signals.

According to the invention, the two different transmission modes advantageously correspond to different images of the same excitation or examination region. According to the invention, two or more different (in particular inhomogeneous) images of the same excitation region are thus advantageously acquired, in particular in a time-interleaved manner.

The transmission modes differ with regard to a transmission characteristic, such as with regard to the amplitudes and/or phases of the transmission signals emitted by the transmission channels.

The acquisition signals associated with the different transmission modes or different images of the same excitation region are advantageously interpreted as belonging to channels of a common image, or as additional or virtual channels of a common image.

Moreover, acquisition signals or measurement processes that are absent due to PPA can be reconstructed or supplemented by means of known methods such as SENSE (see for example WO 99/54746 A1, corresponding to U.S. Pat. No. 6,326,786), SMASH (see for example WO 98/21600 A1, corresponding to U.S. Pat. No. 5,910,728) or GRAPPA (see for example DE 10 2005 018 814 A1, corresponding to U.S. Pat. No. 7,495,437).

A (significantly) more homogeneous or at least essentially homogeneous image can be generated advantageously with the method according to the invention even without a spatially homogeneous transmission characteristic in the sense explained above, thus in particular without a spatially homogeneous transmission characteristic. An additional acquisition time due to the acquisition of multiple images with different transmission modes can be reduced again in that a PPA can be used more effectively due to the (virtually) increased number of acquisition channels. Acquisition signals associated with different transmission modes can thus be treated as (virtual) additional acquisition channels of only one (virtual) common measurement process—even if a measurement process is implemented in each transmission mode. This enables a particularly simple and effective processing of the acquisition signals into a common image, in particular even using methods that are known, proven and used in existing apparatuses.

A particular advantage of the invention is that it can be realized cost-effectively and/or be integrated without high cost into existing systems.

An additional advantage of the invention is that the problems in the image acquisition that result from inhomogeneities of the excitation signal or the transmission characteristic can be reduced, minimized or compensated. In particular given the use of high magnetic field strengths, diffraction effects can lead to shadows, thus (in connection with the excitation of nuclear spins) to sub-regions of the excitation region with reduced, intensified or non-uniform excitation. According to the invention, the nuclear spins are excited a second time, advantageously in the same excitation region, and with a second transmission mode that is different from the first, so regions that are potentially shadowed in the first transmission mode are excited in the second transmission mode and vice versa. It is thus advantageously possible to generate an image using both response signals, which image has reduced or no shadows and/or a significantly better homogeneity.

The transmission modes advantageously differ with regard to the excitation signal, the transmission characteristic and/or the (B1) field distribution, and in particular in a spatial dependency of the excitation of the nuclear spins in the excitation region.

Different excitation or transmission signals are advantageously used in the transmission modes, in particular with regard to the phase position and/or the amplitude. The use of different excitation or transmission signals enables a variation of the transmission characteristic and hereby advantageously enables a generation of different transmission modes without mechanical modifications or the like having to be made at the transmission device, for example (which is also possible, however).

A multichannel transmission method—in particular RF shimming or Transmit SENSE (as explained in the preceding)—is advantageously used to generate different transmission modes. Different transmission characteristics can advantageously be generated particularly simply and quickly via multichannel transmission methods or multiple transmission devices, in particular transmission devices that can be activated at least partially independently of one another.

Additionally, field distributions or transmission characteristics that are different in the transmission modes can be generated particularly simply in that at least two transmission devices are activated with different transmission signals.

Known multichannel transmission methods are designed to ensure an optimally homogeneous excitation of the excitation region. This is advantageously not a requirement in the present invention. It is thus possible to generate a good image, even with different transmission characteristics that are severely inhomogeneous in part. For the present invention, (known) multichannel transmission methods are consequently not a requirement but can advantageously be used for a particularly simple realization.

In one transmission mode an at least significantly circularly-polarized transmission characteristic can be generated. In particular in this regard, adjacent transmission devices can be activated with transmission signals of a phase difference that corresponds to at least essentially 360° divided by the number of transmission device that are used. In another transmission mode, adjacent transmission devices can be activated with transmission signals of a phase difference that corresponds to at least essentially a multiple of 360°, in particular 720°, divided by the number of transmission devices being used. The two examples for particularly preferred transmission modes advantageously have significantly different transmission characteristics. The probably of common shadow regions are minimized via such or other different transmission characteristics, which is advantageously beneficial to the generation of a common homogeneous image.

The acquisition of data in particular occurs in what is known as frequency space or k-space. To generate an image, the data from k-space are in particular Fourier-transformed and therefore are converted into a spatial image. In order to span k-space or, respectively, to enable a later association of properties, signals or the like with a location, a spatial coding of the body is conducted.

At least one phase coding, advantageously via application of a magnetic gradient field, in particular over a specific time period and/or with a specific field strength, can be conducted before the acquisition of the first response signal, and the phase coding(s) advantageously is/are also implemented similarly before the acquisition of the second response signal. In other words, it is advantageously possible to acquire items of information that are independent of one another based on the excitation with different transmission modes, even with addressing of the same k-space line, in particular via selection of the same coding or of the same coding region and the same excitation region.

According to the invention it is also possible to generate a more homogeneous image if both different codings and different transmission modes are used to determine different matrix lines of the measurement matrix. For example, a first matrix line can be acquired with a first coding and a first transmission mode and a second matrix line can be acquired with a second coding and a second transmission mode, wherein the matrix lines, the phase codings and the transmission modes are different. If multiple measurement processes are implemented with the same coding or, respectively, the same coding region and different transmission modes, this abets the common processing into a particularly homogeneous image.

The response signals associated with the different transmission modes are advantageously processed jointly and/or via a Fourier transformation and/or using PPA into the common image.

The response signals determined in the measurement processes are advantageously stored in a common matrix or multiple common matrices.

The transmission modes are in particular changed in alternation in the measurement processes or measurement sequences. For example, a measurement process or a measurement sequence with an excitation in the first transmission mode is initially implemented at least once with a specific coding or in a specific excitation region (in particular its sub-region as well) and a measurement process or measurement sequence with excitation in the second transmission mode is implemented at least once, wherein only then is the coding or the sub-region within the excitation region changed. This interleaved image acquisition or the preferred alternating acquisition of two actual images in the same excitation region or even in the same sub-region allows a particularly good compensation of shadows or other inhomogeneities and/or a compensation or reduction of artifacts. In particular, the time between two measurement processes or measurement sequences in the same excitation region or sub-region can thus be minimized, whereby disadvantages (such as artifacts) due to possible movements of the excitation region or subregion to be examined or the like can be minimized. The same also correspondingly applies when codings or, respectively, coding regions or measurement or evaluation regions that are situated next to or close to one another are excited and measured in alternation with different transmission modes.

A common processing of the response signals and/or measurement matrices into the common image offers the advantage of a lesser artifact formation, in particular given the use of PPA. Artifacts can arise in PPA via the reconstruction of information such as matrix lines or measurement matrices. The common processing therefore has the advantage that more or different information is provided for conversion of the response signals into an image than given a processing of individual images. In comparison to a separate conversion of response signals associated with different transmission modes into separate images and a subsequent combination into a common image, the artifact formation can thus in particular be reduced or avoided. However, according to the invention a processing via the generation and merging of individual images is also possible.

The response signals are advantageously converted via a Fourier transformation into a common image since this has proven to be particularly efficient in the examinations. In particular, a discrete Fourier transformation (DFT) or a fast Fourier transformation (FFT) can be implemented that can advantageously be implemented well via software and/or with a processor.

The processing of the response signals associated with different transmission modes into the common image with PPA is particularly preferred. Response signals, matrix lines or measurement matrices associated with different transmission modes can also be advantageously used in order to drastically reduce the acquisition time. According to the inventive method, the excitation region is excited at least twice using different transmission modes, which in a first approach can extend the measurement process. However, in connection with PPA it is possible to use the additional response signals due to the additional or second transmission mode for acceleration, and to hereby at least significantly compensate for potential velocity disadvantages. This is explained in detail in the following.

The response signals associated with the different transmission modes (in particular to implement a PPA) are advantageously interpreted as different acquisition channels and/or matrix lines of only one measurement process or as corresponding to different acquisition channels of only one measurement process, or are treated as such. A particularly simple implementation of the method according to the invention is also possible in this way in already existing systems. To accelerate the measurement sequence, known PPAs use information from different acquisition channels (in particular different acquisition channels associated with acquisition devices) in order to be able to reconstruct an image with a reduced number of measurement processes, or given the use of a subsampling.

According to the invention it is possible to also use response signals, matrix lines or measurement matrices associated with different transmission modes to reconstruct data that were not acquired or were not stored by omitted measurement processes, due to subsampling or the like. PPA can be particularly advantageously used for this purpose, in particular in that a response signal associated with an additional transmission mode is interpreted as an additional acquisition channel of the same measurement process, or as corresponding to such an additional acquisition channel, or is treated as such.

An evaluation device according to the invention is characterized by a means to generate a common image from response signals that are in particular associated with different transmission modes, or first and second response signals. In particular a more homogeneous image, thus an image with fewer shadows and/or artifacts due to an inter-homogeneous excitation signal, can thus be generated. The evaluation device advantageously has a program in order to interpret response signals associated with different transmission modes as acquisition channels and/or matrix lines of only one measurement process, such that more information is accordingly available for a PPA.

According to the invention, the evaluation device can also be part of a control device or a magnetic resonance tomography scanner and/or control the transmission modes.

It is also possible for the evaluation device to be executed as a program or software and, for example, is executed in parallel or temporally interleaved with other programs on a computer or processor. However, it is likewise possible for the evaluation device to be or to form a separate element, module or component.

A magnetic resonance tomography apparatus according to the invention is provided with the described evaluation device and/or fashioned to implement the method according to the invention. The magnetic resonance tomograph advantageously has a transmission device to generate different transmission modes for different excitation of nuclear spins in the excitation region. The corresponding advantages as described above can thus be achieved.

DESCRIPTION OF THE PREFERRED EMBODIMENTS

In the figures the same reference characters are respectively used for the same parts and components, wherein corresponding advantages and properties result even though a repeat description is omitted.

Figure 1:
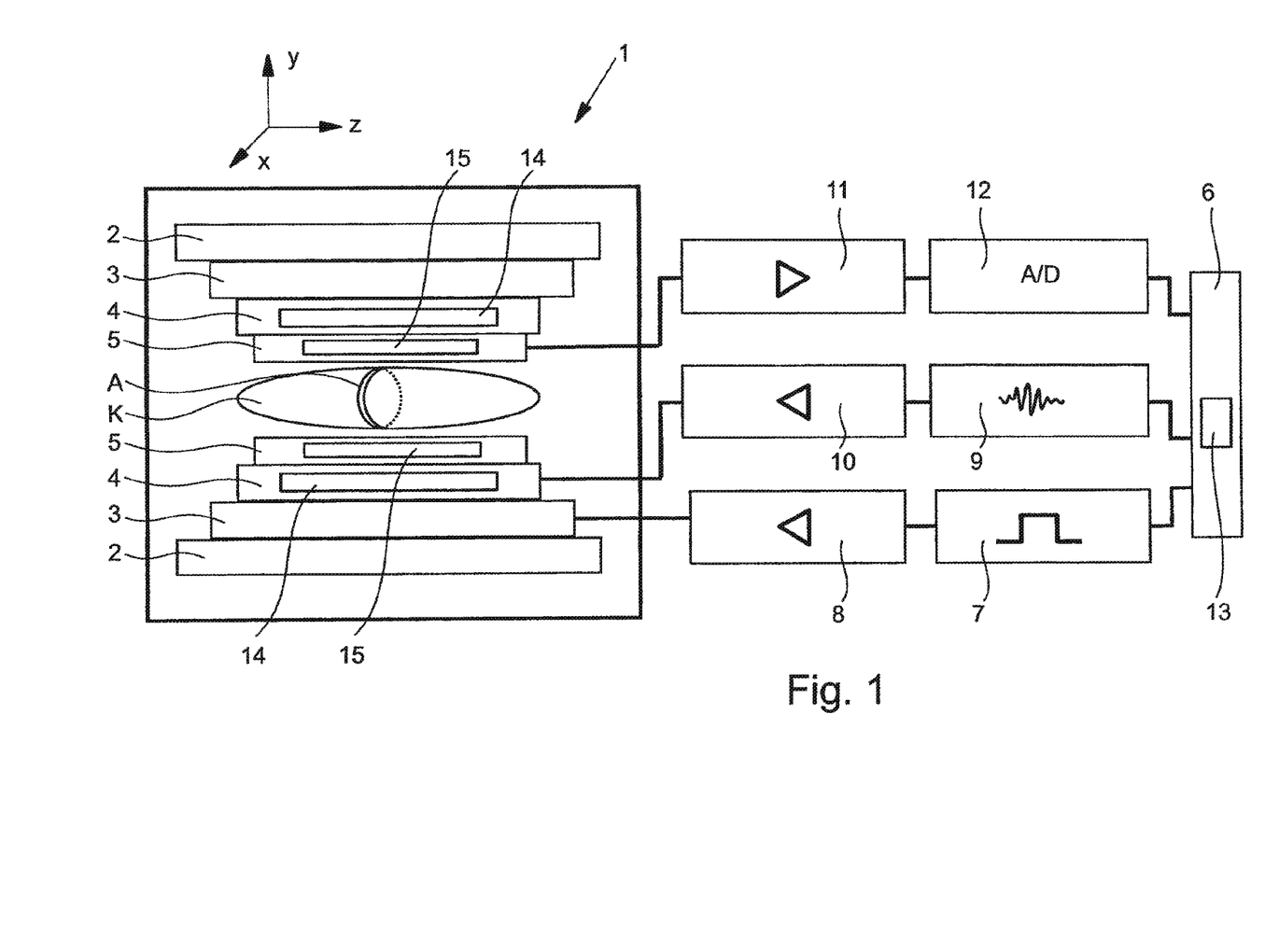
FIG. 1 schematically illustrates a magnetic resonance tomography apparatus with an evaluation device according to the invention.

FIG. 1 shows a schematic design of a magnetic resonance tomography apparatus 1 with a basic magnet 2 to generate a basic magnetic field, gradient coils 3 to generate gradient fields, and a transmission device 4 to generate at least one excitation signal in the aforementioned sense, in particular to excite nuclear spins in an excitation region A of a body K to be examined (in particular of an animal or person). The tomography apparatus 1 advantageously has an acquisition device 5 to acquire response signals AS of the nuclear spins, as was already addressed in the preamble.

Figure 2:
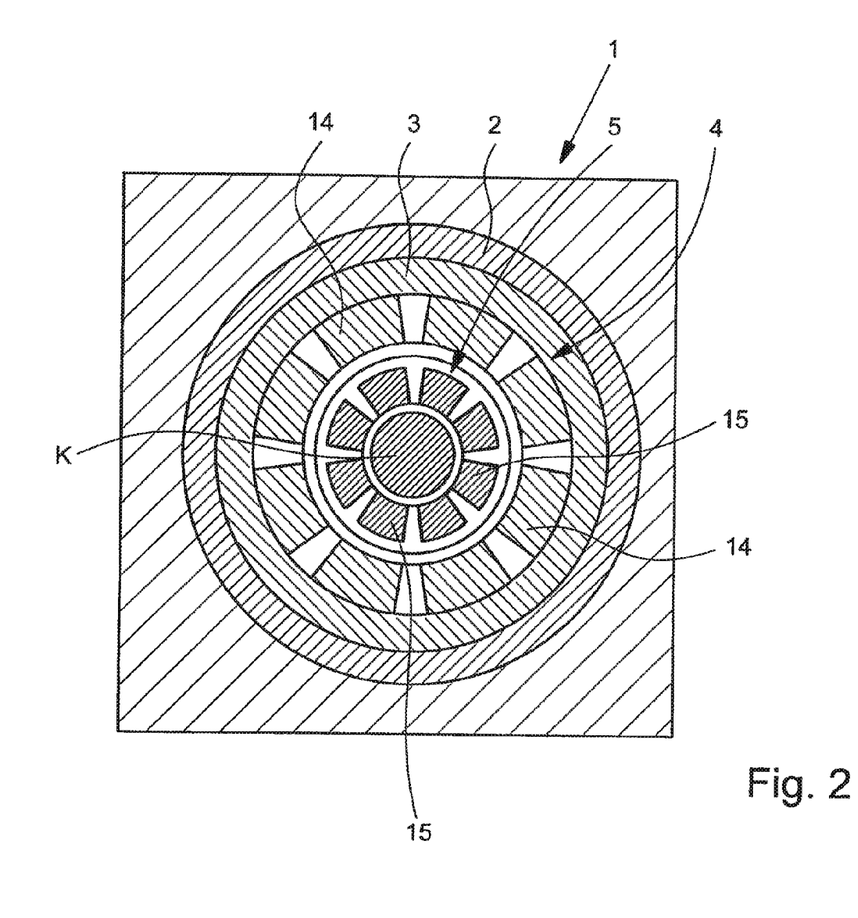
FIG. 2 schematically illustrates a section of the magnetic resonance tomography apparatus.

FIG. 2 shows an abstracted section of the tomography apparatus 1 with the transmission device 4, which advantageously has multiple (here eight) transmission devices 14 and with an acquisition device 5 that advantageously has multiple (here the eight) acquisition units 15.

The basic magnet 2 generates a strong, optimally homogeneous and in particular static magnetic field that extends in the longitudinal direction of the tomography apparatus 1 (z-direction) and that is typically designated as a basic magnetic field or B0 field with which nuclear spins of a body K to be examined are aligned. A regulation device that regulates the magnetic field to an at least essentially constant value can be associated with the basic magnet 2.

Gradient fields (gradients) are magnetic fields with a spatially dependent, variable magnetic field strength. They can be generated by one or more gradient coils 3. Gradients with a specific field strength distribution are advantageously generated with the gradient coils 3 over or for a specific time period. For this a pulse can be used, wherein a gradient field develops at the beginning of the pulse, which gradient field collapses again with the end of the pulse. This pulse can in particular be at least essentially constant or invariant in its curve. Even if pulses are henceforth discussed in connection with the generation of gradients, this includes arbitrary other control signals to activate or deactivate or charge gradient coils 3.

The tomography apparatus 1 advantageously has a control device 6. This can advantageously generate a pulse via or with a pulse generator 7, which pulse is amplified by a gradient amplifier 8 and is converted into a gradient (field) in the gradient coils 3.

The gradient coils 3 can advantageously be controlled independently. In particular, multiple gradient amplifiers 8 and/or pulse generators 7 can also be provided for this purpose.

To generate excitation signals, the control device 6 advantageously controls an RE pulse generator 9 that generates one or more transmission signals—thus in particular pulse-shaped radio-frequency signals as explained above—that is or are amplified by an RF amplifier 10 and relayed to the transmission device 4 or to the transmission units 14 associated therewith.

If the acquisition device 5 has multiple acquisition units 15, the response signal AS also in particular has a corresponding number or acquisition signals or acquisition channels associated with these. The acquisition device 5 advantageously acquires and transmits the response signal AS to an RF receiver 11. The response signal AS that is amplified by the RF receiver 11 and digitized by a transducer 12 is advantageously cached, in particular in a matrix M or multiple matrices M, and/or is in particular processed into an image B in the control device 6 and/or by an evaluation device 13, which is explained later using the schematic representation according to FIG. 4.

The evaluation device 13 can be or form an integral component of the control device 6 or of the tomography apparatus 1 or a separate component. The evaluation device 13 forms a computer system, a program in a computer system or a portion of this. It is advantageously possible in existing systems to also realize the evaluation device 13 in the form of an additional program component in an existing computer system, or to process it with an already present processor.

In the following a measurement process is explained as an example using FIG. 1. As was already mentioned, the resonance or, respectively, Larmor frequency of the nuclear spins is dependent on the external magnetic field. In order to enable a spatial resolution (and thereby enable an imaging), the external magnetic field is advantageously designed to be spatially dependent, in particular via superimposition of the basic magnetic field with one or more gradient fields (also called gradients). A gradient thus in particular also produces a spatial dependency of the Larmor frequency.

A Cartesian coding by means of gradients in all three spatial directions is most common. Therefore z-, x- and y-gradients or coding is discussed in the following. For example, the z-direction can hereby coincide with the alignment of the basic magnetic field, the x-direction can run horizontally and perpendicular to the z-direction and the y-direction can run vertically and perpendicular to the two other directions. However, a spatial coding can also take place in another manner or for another coordinate system, wherein the following descriptions correspondingly apply.

a) To generate an image, the basic magnetic field is superimposed with a z-gradient, whereby the magnetic field strength in the examination subject increases or decreases in a spatially dependent manner in the z-direction. The Larmor frequency with which the spins can be excited is likewise spatially dependent over these gradients but at least essentially identical in the planes perpendicular to the gradient alignment (here in the x-y planes). In the excitation range A, a specific slice corresponding to the Larmor frequency can thus be selectively excited via an excitation signal with portions at a specific Larmor frequency, and using an excitation signal with a certain bandwidth—thus a number of contiguous Larmor frequencies—a slice region can also be selectively excited. "Excitation of a slice" thus means the excitation of nuclear spins in an essentially flat, level or planar sub-volume of the body K or in another excitation region A.

The response signal AS caused by the excited nuclear spins represents a superimposition of the effects of all excited nuclear spins. In order to obtain conclusions about the properties of a small volume element or voxel, phase codings (b) and/or frequency codings (c) are produced. An association of a portion of the response signal—in particular of a spectral portion—with a volume element or voxel can be enabled via these codings.

b) For example, a y-direction directed in a coding direction (here in the phase direction or y-direction) is applied for the phase coding of the excited slice, which y-gradient leads to a spatially dependent curve of the magnetic field strength or, respectively, the Larmor frequency in the y-direction. Depending on the strength of the gradient—thus the spatially dependent field strength change—and the time period that the y-gradient is present, phase differences with a spatial dependency on the y-coordinate or, respectively, in the y-direction. A corresponding gradient for a certain time period which in particular corresponds to a pulse-shaped curve of the y-gradient is thus advantageously generated for a phase coding. The precise properties of the phase coding can in particular be determined or affected by the duration and the strength of the pulse. Equiphase (in-phase) regions arise essentially perpendicular to the y-direction. Since only excited spins can also contribute to a response signal, in particular line-like excited, equiphase regions or measurement regions or sub-regions U (see FIG. 4) arise in this manner in the y-direction.

c) In particular during the acquisition of a response signal AS, a gradient is generated in the third spatial direction (thus an x-gradient in this example) for frequency coding. This in turn leads to a spatially dependent frequency shift of the Larmor frequency. Due to the frequency coding during the acquisition of a response signal AS it is possible to associate a frequency or a spectral portion of a response signal AS that is associated with this frequency (and in particular its phase and amplitude information) with an x-coordinate or a corresponding volume region of the body to be examined.

d) To acquire or measure the response signal AS via the acquisition device 5, the pulse generator 7 is in particular instructed by the control device 6 to generate a pulse for a gradient in the x-direction that in particular is intensified by the gradient amplifier 8 and transmitted to the gradient coils 3. The gradient generated and advantageously aligned in the x-direction in such a manner in particular leads to a frequency coding via the different, spatially dependent field strengths and corresponding Larmor frequencies. The response signal AS is acquired in this state of the tomography apparatus 1. For this the response signal AS—in particular one or more acquisition signals—can be acquired by the acquisition device 5 or by one or more acquisition units 15. The response signal AS is amplified by the RF amplifier 11 and/or digitized by the transducer 12. According to the invention, a separate RF amplifier 11 and a separate transducer 12 can be provided for each acquisition unit 15. The response signal AS is supplied to the evaluation device 13, in particular via the control device 6 in the exemplary embodiment according to FIG. 1.

The response signal AS in particular has a certain bandwidth, wherein the frequencies or frequency portions of the response signal AS can be associated with an x-coordinate via the spatial dependency of the Larmor frequencies or field strengths given an activated gradient. This can also take place via the evaluation device 13.

The z-coordinate has advantageously already been established in advance via the excitation of only one slice or one excitation region A. However, this coordinate can optionally or alternatively have been defined or coded via an additional phase coding, in particular in the case of a 3D exposure.

e) In order to also achieve a resolution in the phase coding or y-direction in the exemplary embodiment, the described measurement process can be repeated multiple times or, respectively, be executed as a measurement sequence. The step of the phase coding is advantageously respectively varied by modifying the strength and/or time of the corresponding (y-)gradient. The response signals AS of each individual measurement are advantageously received by the RF receiver 11, transduced by the transducer 12 and additionally processed and/or stored by the evaluation device 13.

The acquired or measured response signals AS or acquisition signals are advantageously collected, stored, additionally processed, output and/or evaluated in another manner by the evaluation device 13. However, these objects can also be taken over or executed in part or completely by other components, devices or units, for example thus by the acquisition device 5, control device 6, the tomography apparatus 1 and the like, as well as by an associated data processing system.

Figure 4:
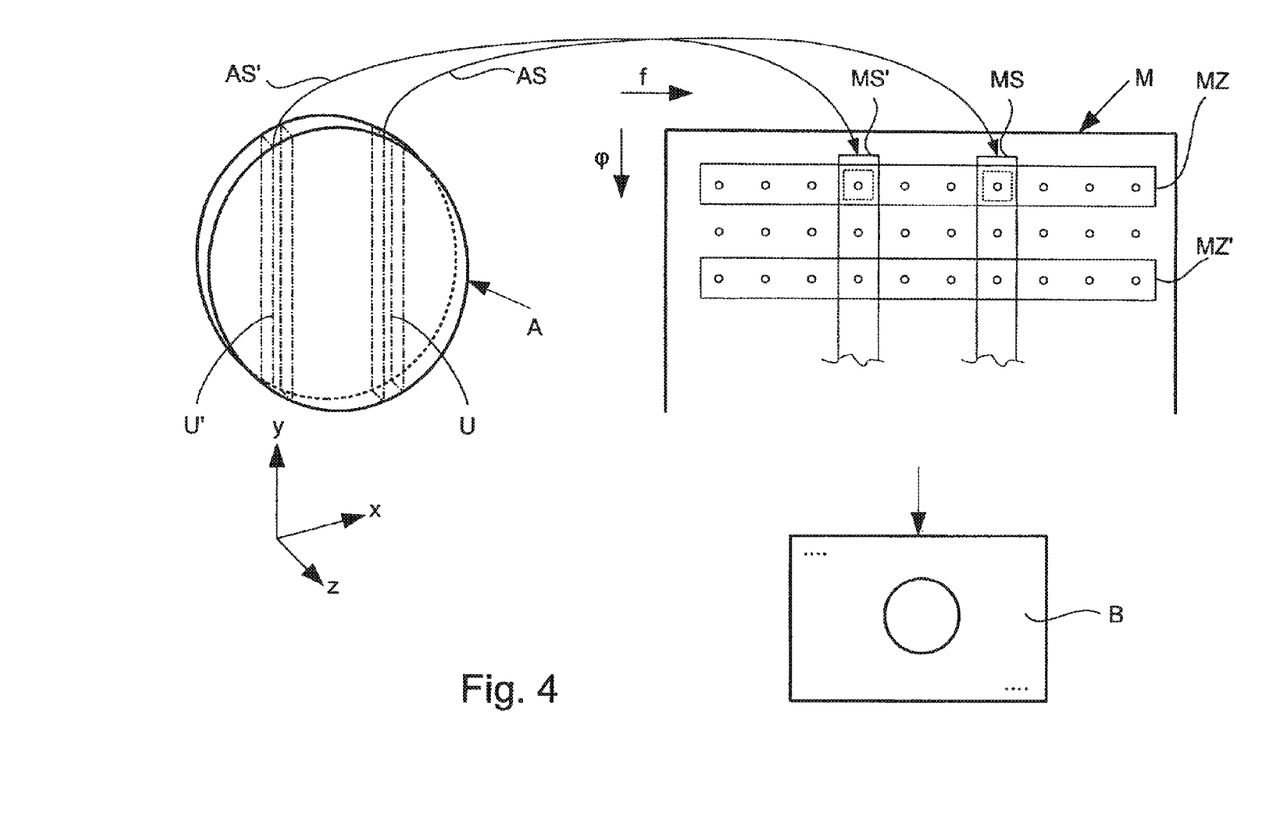
FIG. 4 is a schematic representation of the acquisition of the response signals in a matrix and the conversion into an image.

The response signals AS or acquisition signals are stored (in their digitized form) as a matrix line MZ or matrix column MS of at least one matrix M, as is indicated in FIG. 4. For example, given a frequency coding of the excitation region A in the x-direction a spectral range of the response signal AS can be associated with a sub-region U via the Larmor frequency. This corresponds to a matrix element of the matrix M, wherein a matrix column MS can be associated with a frequency f and a matrix line MZ can be associated with a phase coding (indicated with $\phi$ in FIG. 4).

The evaluation device 13 can decompose a response signal AS into spectral portions and generate matrix elements of a matrix column MS corresponding to the frequency f, in particular the Larmor frequency. In particular a sub-region U of an excitation region A (in particular via the frequency coding), a spectral portion of a response signal AS (in particular at a Larmor frequency) and/or a matrix column MS thus correspond to one another. A measurement process with a phase coding can correspond to a matrix column.

An image B can then advantageously be generated from the matrix M by the evaluation device 14, in particular by means of a Fourier transformation. For example, the image B can be displayed, stored or relayed or output in another manner.

The workflow of a measurement process described in the preceding segment should form the basis of the following description of a workflow according to the invention. As used herein a "measurement process" means the sequence described here or in the preceding, composed of the excitation of an excitation region A, advantageously a phase coding and/or frequency coding and a reception or acquisition process, in particular according to the explanations above. A measurement sequence designates a sequence of such measurement processes.

The inventive method operates with at least two different transmission modes. In a first measurement process the excitation region A is excited in or with a first transmission mode, and a corresponding response signal AS from the excitation region A is acquired according to the procedure already described. According to the invention, the excitation region A is additionally excited at least a second time and using a second transmission mode different from the first, and a second response signal AS associated with the second transmission mode is acquired. The two transmission modes in particular correspond to different transmission characteristics or excitation signals, thus actually to two different images. According to the invention, however, a common image B is generated from the response signals corresponding to the transmission modes, as is explained in detail in the following.

A measurement sequence according to the invention starts with a measurement process in a first transmission mode. A second measurement process is executed with a second transmission mode. Apart from the use of different transmission modes, the two measurement processes are preferably identical and/or take place in immediate succession. Additional measurement processes are subsequently implemented in which codings that are advantageously identical but different relative to those already implemented are used, in particular different phase codings. The additional measurement processes are advantageously likewise implemented in alternation with the first and second transmission mode. However, according to the invention it is also possible to first implement multiple measurement processes with the first transmission mode and then to implement multiple measurement processes with the second transmission mode in a measurement sequence according to the invention. It is also possible to implement a first measurement process in a first transmission mode with a first phase coding and a second measurement process in a second, different transmission mode and with a second, different phase coding, even though the previously described procedures are more advantageous with regard to the implementation of a PPA, as explained below in detail.

A matrix line of a matrix M is advantageously generated in each measurement process. Using multiple transmission modes it is consequently possible to generate a number of measurement matrices M corresponding to the number of transmission modes. This can in particular also be understood as a three-dimensional matrix or the like, even though the following discussion refers to different matrices M. The method according to the invention is therefore explained in detail using matrices M and matrix lines MZ, in particular using FIG. 4, wherein the method is not limited to a specific (in particular mathematical) mode of presentation.

According to the invention, a first matrix line MZ can be determined in a first transmission mode and a second matrix line MZ can be determined in a second transmission mode via measurement processes. According to the invention these lines can be determined with an essentially identical method, apart from the different transmission modes. The first matrix line MZ can be associated with a first matrix M and the second matrix line MZ can be associated with a second matrix M. Matrices M associated with the different transmission modes are thus filled line by line in alternation, wherein at least essentially the same coding can be conducted for the determination of the respective matrix line MZ or for the acquisition of the response signals AS corresponding to this.

According to the invention it is also possible to first determine multiple response signals AS associated with a first transmission mode—in particular using different phase coding steps—and then to determine the or corresponding response signals AS associated with a second transmission mode. However, an alternating determination of response signals AS with the first and second or additional transmission mode is advantageously to follow tests, in particular with regard to an optimally minimal movement artifact formation.

The measurement processes for individual matrix lines MZ within a matrix M thus in particular differ via possible phase coding steps which are associated with gradients (in particular in the y-direction) of different strength and/or lasting a different length of time. The matrices M can differ among one another due to the association with different transmission modes, but also via different acquisition channels, which is explained in detail later.

To determine matrix elements of a matrix line MZ of a first matrix M it is preferred (for example) to excite nuclear spins in an excitation region A of a body K to be examined in a first transmission mode by transmitting an excitation pulse via the transmission device 4, to acquire a first response signal AS (associated with the first transmission mode) from the excitation region A with the acquisition device 5, to optionally amplify the response signal AS with the receiver 11 and/or to convert it with the transducer 12 and to store said response signal AS as a matrix line MZ in a first matrix M.

In a second step the same procedure can be implemented with a second transmission mode that is different from the first transmission mode, wherein the second response signal AS associated with the second transmission mode is acquired from the excitation region A, advantageously is digitized by the transducer 12 and is saved or stored as a matrix line MZ in a second matrix M. The entire method can be repeated in succession with different phase codings, wherein the matrices M corresponding to the respective transmission modes are successively filled. According to the invention, the described procedures are also possible with more than two (in particular three, four or more) transmission modes. A corresponding number of X matrices M arise in this manner given a use of X transmission modes according to the invention.

The matrices M can be processed into a common image B by the evaluation device 13, in particular by means of a Fourier transformation.

According to the invention, individual images can also first be respectively generated from the individual matrices M, which individual images are combined into a common image B in the following, in particular via a quadratic summation. However, a common processing of all matrices M has the advantage that image adulterations due to artifact formation are reduced or avoided.

In the method according to the invention, a homogeneity of the excitation of the excitation region A that is as optimal as possible is particularly advantageously no longer a basic requirement for a more homogeneous image result. For example, the excitation in a first transmission mode that is in particular not optimally homogeneous can lead to the situation that certain sub-regions of the excitation region A are not or are not sufficiently excited or, respectively, shadowed. In that the second transmission mode is different than the first, possible shadows will occur in other sub-regions of the excitation region A. Since a common image is generated with the first response signal AS and the second response signal AS, the shadows can be compensated and a more homogeneous image can be generated, in particular when the respective excitations themselves and images corresponding to these do not have optimal homogeneity.

It is not necessary for The inventive method to use a complex transmission system. There is thus no need for a complicated pulse generator 9 to generate special curves that are temporally variable with regard to amplitude and phase for transmission signals. It can be only different transmission modes that should be generated that advantageously differ with regard to the transmission characteristic (as described above), in particular the B1 field distribution (or their homogeneity).

In the following preferred methods in order to generate different transmission modes should be discussed in detail.

In the tomography apparatus 1 (in particular according to FIG. 2), to generate different transmission modes the transmission units 14 can be activated with different transmission signals (in particular with regard to phase position and/or amplitude). In order to generate different transmission modes, it can be sufficient if one of the transmission signals is modified with regard to the phase position and/or the amplitude. Using eight transmission devices 14 as in the exemplary embodiment shown in FIG. 2, in the following the generation of different preferred transmission modes is explained in more detail as an example.

The transmission modes advantageously differ with regard to a spatial dependency of the excitation of the nuclear spins in the excitation region A. For example, for this the eight transmission units 14 depicted in FIG. 2 can be activated with transmission signals of at least essentially the same amplitude and a phase difference of approximately 45° between adjacent transmission units 14. An essentially circularly polarized transmission characteristic can be generated. For example, a second transmission mode can have a phase difference of 90° between adjacent transmission devices 14, which leads to a transmission characteristic that significant deviates in comparison to the first transmission mode. In this way it is possible to generate transmission modes that typically have a significantly different response (behavior) with regard to potential shadows and thus are advantageous for the generation of a common, more homogeneous image.

Expressed in a general way, between two adjacent transmission units 14 or transmission signals associated with these a first preferred transmission mode (in particular in the sense explained above) can have phase differences of 360° divided by the total number of transmission units 14; a second transmission mode can have phase differences of 720° divided by the number of transmission devices 14. This can also be continued with other (in particular at least essentially whole-number) multiples of 360° (1080°, 1440°, . . . ) in order to generate more than two transmission modes with different responses in a simple manner. It is advantageously additionally provided that the phase differences between two non-adjacent transmission units 14 or transmission signals associated with these are in particular always greater than the phase differences between two adjacent transmission units 14. This can correspondingly be applied to multiples of 360° but also in principle to fractions of 360°, in particular 180°.

Since there are no significant requirements for the homogeneity of the transmission characteristics or the achieved excitations for the respective transmission modes in the method according to the invention, the method can be advantageously combined with different multichannel transmission methods, in particular simple multichannel transmission methods and/or multichannel transmission methods that are also conventional in 1.5 T or 3 T tomographs.

RF shimming is a transmission method in which respective transmission signals of previously determined or, respectively, established phase position and amplitude are used for different transmission units 14. The established phase positions and amplitudes can be varied between two measurement processes and can thus also be used to generate different transmission modes.

Although Transmit SENSE systems go far beyond the capabilities of an RF shimming system, they likewise allow the generation of different transmission modes. In particular, given the use of the method according to the invention the mentioned multichannel transmission methods can advantageously be significant simplified with regard to the necessary expenditure for calibration.

Transmission devices 4 with multiple transmission channels or multiple transmission units 14 advantageously abet a simple and flexible generation of different transmission modes. However, according to the invention it is also possible to generate the required different transmission modes with only one transmission unit 14, in particular via its different activation, mechanical modification or the like.

The same accordingly also applies for the acquisition device 5, which advantageously has multiple acquisition units 15 (as described above). Multiple acquisition units 15 or channels associated with them can advantageously be used in particular to accelerate methods to generate an image B with a tomography apparatus 1 via partial parallel acquisition (PPA) methods, which is discussed in detail below.

Figure 3:
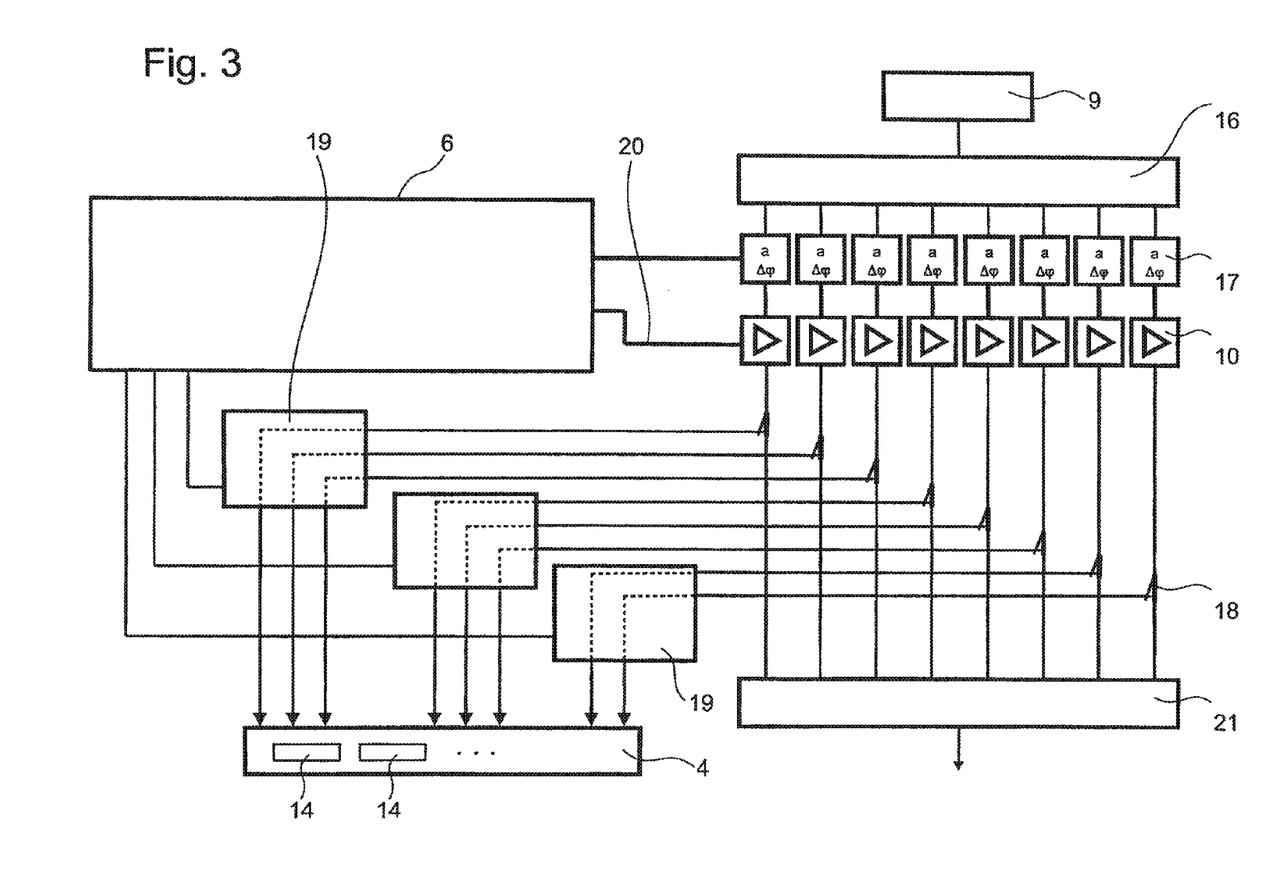
FIG. 3 is a schematic block diagram of a multichannel transmission system for the magnetic resonance tomography apparatus.

Using a schematic block diagram, FIG. 3 shows a preferred design of a system to generate transmission signals for a tomography apparatus 1. In the shown system only a single RF pulse generator 9 is necessary in order to generate transmission signals for eight different transmission devices 14. For this the reference signal generated by the RF pulse generator 9 can be divided in a power splitter 16 and be supplied to phase shifters 17. The phase shifters 17 can affect the signal with regard to the amplitude a and the phase $\phi$, in particular according to the specifications of the control device 6. The respective transmission signals that are generated in such a manner are preferably amplified by RF amplifiers 10. To implement an excitation with the multichannel transmission system, the respective transmission signals are relayed via coupler or switches 18 to individual transmission units 14 of the transmission device 4. Signal power sensors 19 are advantageously provided to monitor and regulate the output power. The information that is hereby obtained can be used in the control device 6 in order to regulate the power or amplification of the RF amplifier 10 via a control line 20, and to also implement an emergency shutdown in the event that a threshold is exceeded.

In the multiband transmission system shown in FIG. 3, in addition to the activation of multiple transmission devices 14 it is provided as an option that it can also be operated with only one channel. For this the system has an optional power adder 21. If the switches 18 relay the radio-frequency signals from the RF amplifiers 10 to the power adder 21, this can combine the output powers and provide a single transmission signal of correspondingly higher power.

The multiband transmission system described using FIG. 3 comes with only a single RF pulse generator and is arbitrarily scalable with regard to the number of channels, and thus with regard to the number of different transmission signals, the RF amplifiers 10, the phase shifters 17 and the signal power sensors 19. Such a system can advantageously be used in order to generate different transmission modes.

Depending on the number and form of the transmission modes, the system shown in FIG. 3 can even be additionally reduced in terms of its complexity. In the example already explained for the generation of different transmission modes, adjacent transmission units 14 are activated with transmission signals of a phase difference that in one transmission mode corresponds to 360° and in a further transmission mode corresponds to 720°, divided by the number of channels. Here it can be sufficient to use phase shifters corresponding to the phase differences of the first transmission mode, which phase shifters are not or do not need to be adjustable. In a concrete example with eight transmission units 14, the phases can be hard-set at 0°, 45°, 90°, . . . 315°, for example. In the second transmission mode, only ever second phase shifter is necessary due to the doubled phase difference. A switching between the transmission modes takes place by the association of the transmission signals with the respective transmission elements, for example by simple switches (not shown).

With regard to the example with eight transmission devices 14 according to FIG. 2, for example, a first phase shifter 17 at 0° can in turn activate a first transmission unit 14 and its fourth neighbor. A second phase shifter with 45° is not used. The third phase shifter with a setting of 90° activates the transmission unit 14 adjacent to that activated with 0° and in turn activates its fourth neighbor. Given systematic continuation only every second phase shifter is consequently required, and the transmission unit 14 activates its arrangement correspondingly with 0°, 90°, 180°, 270°, 360° (=0°), 450° (=90°), 540° (=180°) and 630° (=270°).

An alternative or extension (not shown) to the transmission system shown in FIG. 3 for the generation of different transmission modes represents an arrangement with interleaved hybrids, in particular branch line couplers and/or with a Butler matrix. With such an arrangement a signal can be split up into different phase positions. Such an arrangement preferably has multiple inputs and outputs, wherein a change of the respective input leads to different phase positions and/or phase differences at the outputs relative to one another. For example, the outputs of the aforementioned arrangement can be connected with transmission devices 14. Different transmission modes can thus advantageously be realized particularly simply and cost-effectively by activating different inputs of the arrangement.

An additional alternative to the generation of different transmission modes presents one or more mechanically movable (in particular rotatable) transmission units 14 or a corresponding transmission device 4. In this way it is possible to generate different transmission modes even without an activation of different transmission devices 14 with excitation signals of different phase positions and/or amplitudes. Alternatively or additionally, it is also possible to generate different transmission modes even with only one transmission device 14 by different activation thereof.

The method according to the invention can be particularly preferably combined with PPA at the acquisition. This is explained in detail in the following using the exemplary embodiments.

PPAs enable the acceleration of a measurement, in particular in that the acquisition of response signals AS or of matrix lines MZ associated with these are omitted and these are reconstructed by utilizing information of multiple independent acquisition signals.

An acquisition device 5 with multiple acquisition units 15 and acquisition channels associated with these is a requirement to implement known PPAs. In FIG. 2 the acquisition device 5 has eight acquisition units 15. In a measurement process a response signal AS can consequently be determined with up to eight acquisition signals, wherein a line MA of a matrix M can advantageously be obtained from each of the acquisition signals. For example, eight matrices M are formed in parallel. At the same time, measurement processes are omitted to accelerate the measurement sequence, whereby the matrices M can respectively be incomplete. With different PPAs it is possible to subsequently reconstruct matrix lines MZ on the basis of multiple incomplete matrices M, and in fact per response signal AS up to a number that corresponds to the number of acquisition signals.

PPAs can yield additional synergistic effects in combination with the method according to the invention. It is thus possible that response signals AS associated with different transmission modes, or acquisition signals associated with these response signals, are used in order to likewise reconstruct matrix lines MZ or measurement processes omitted with PPA. In this way The inventive method is not only compatible with PPA, it can also be significantly accelerated by PPA. A homogenization of the image with simultaneous acceleration of the measurement is thus possible, in particular if the method according to the invention is combined with PPA.

With the method according to the invention it is advantageously possible to apply a PPA method even given tomography apparatus 1 with only one acquisition unit 15. For this response signals AS associated with different transmission modes are advantageously acquired and matrices M associated with the transmission modes are successively created. It is possible to omit measurement processes. Instead of subsequently determining data missing with PPA on the basis of the information of multiple independent acquisition units 15 (such as antennas or coils), the matrices M associated with the different transmission modes are processed via PPA. For this the response signals AS can be interpreted as corresponding to different acquisition signals or acquisition channels of only one measurement process, or can be treated as such. Although nuclear spins in the excitation region A are excited at least one second time and using a second transmission mode that is different than the first to homogenize the image, at least essentially there is no time loss connected with the described manner. Naturally, the described procedure can be implemented accordingly with multiple acquisition units 15 and/or multiple transmission modes.

In the exemplary embodiment according to FIG. 2, the tomography apparatus 1 has an acquisition device 5 with eight acquisition units 15 and acquisition channels associated with these. In combination with a method according to the invention with (for example) two transmission modes, the number of matrix lines MZ to be acquired is advantageously measured at least essentially using a system with 16 acquisition units 15. Using the eight acquisition units 15, in particular eight incomplete matrices M are determined per transmission mode and the PPA method can be implemented with all 16 incomplete matrices M, even through physically only eight acquisition channels are present. The method according to the invention is accordingly applicable to other PPAs, even if these use other representations than matrices M and/or matrix lines MZ.

The described procedure can be expanded to an arbitrary number X of transmission modes and a number Y of acquisition units 15, wherein the data reduction to accelerate the measurement method is advantageously designed using X multiplied with Y channels. According to the invention, the X multiplied by Y matrices M determined according to the invention can be interpreted as different acquisition channels corresponding to only one measurement process for implementation of the respective PPA, or can be treated as such.

The method according to the invention was explained as an example using a tomography apparatus 1, wherein the transmission device has eight transmission units 14 and the acquisition device 5 has eight acquisition units 15. However, according to the invention it is also possible for the method to be implemented with a transmission device 4 with an arbitrarily different number of transmission units 14 and/or with an acquisition device 5 with an arbitrarily different number of acquisition units 15. It is additionally already possible to also implement the method according to the invention with only one transmission unit 14 and/or only one acquisition unit 15, and in particular to combine it with PPA. However, it is advantageously possible to generate different transmission modes with more than one transmission unit 14 in a particularly simple and effective manner.

Using multiple transmission modes and only one acquisition unit 15 it is also already possible to use a PPA to accelerate the method according to the invention. The use of multiple acquisition units 15 is preferred, however, since the entire process of the image generation can hereby be additionally accelerated, in particular by means of PPA, and/or be improved with regard to the image quality.

The method according to the invention has been described in connection with the spanning of Cartesian k-space, wherein gradients are used in the x-, y- and z-direction. However, the method according to the invention can also be transferred to other methods of region selection and phase and/or frequency coding. The method described can thus also be implemented with gradients that are linearly independent in another manner and/or can define, code or address a plane or a space. In particular, the gradients in the different directions can be arbitrarily exchanged among one another. An application of the method according to the invention can also be applied not only to 2D methods but also to 3D methods for imaging with a tomography apparatus 1.

According to the invention it is also possible that the transmission device 4 and the acquisition device 5 are not executed separately but rather the transmission units 14 can also act (in particular in part) as acquisition unit 15, and vice versa.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to generate a magnetic resonance image, comprising the steps of:
    operating a magnetic resonance data acquisition unit, in which a subject is located, by radiating a first radio-frequency (RF) excitation field in said data acquisition unit using a first RF transmission mode that causes a first magnetic resonance response signal to be emitted from said nuclear spins in said excitation region, and to detect said first magnetic resonance response signal as detected first magnetic resonance data;
    entering said first magnetic resonance data into an electronic memory, organized as k-space with a plurality of data entry lines therein, by entering said first magnetic resonance data into a first set of said lines in k-space;
    operating said magnetic resonance data acquisition unit to excite said nuclear spins in said excitation region of said subject by radiating a second RF excitation field in said data acquisition unit interleaved in time with radiating said first RF excitation field, using a second RF transmission mode, said second RF excitation field differing from and not being superimposed with said first RF excitation field, and said second RF transmission mode not being an identical repetition of said first RF transmission mode, that causes a second magnetic resonance response signal to be emitted from said nuclear spins in said excitation region interleaved in time with said first magnetic resonance signal, and to detect said second magnetic resonance signal as detected second magnetic resonance data;
    entering said second magnetic resonance data into a second set of said lines in k-space, said first set of said lines and said second set of said lines being interleaved with each other in k-space, thereby producing interleaved first and second magnetic resonance data in said memory; and
    from a computer processor, accessing the interleaved first and second magnetic resonance data from said memory and, in said computerized processor, reconstructing a common, single magnetic resonance image from said interleaved first and second magnetic resonance response data from said memory, and making a data file comprising said common, single magnetic resonance image available in electronic form at an output of said computerized processor.

2. A method as claimed in claim 1 operating said magnetic resonance data acquisition unit with said first RF transmission mode having a transmission characteristic that differs from a transmission characteristic of said second RF transmission mode.

3. A method as claimed in claim 1 comprising operating said magnetic resonance data acquisition unit with said first RF transmission mode to give said first excitation field an RF field distribution that differs from an RF field distribution of said second excitation field produced by said second RF transmission mode.

4. A method as claimed in claim 1 comprising operating said magnetic resonance data acquisition unit in said first RF transmission mode by generating first transmission signals having an amplitude and a phase, and operating said magnetic resonance data acquisition unit in said second RF transmission mode by generating second transmission signals having an amplitude and a phase, with at least one of the amplitude and the phase of said first transmission signals differing from at least one of the amplitude and the phase of the second transmission signals.

5. A method as claimed in claim 1 comprising operating said magnetic resonance data acquisition unit to produce said first RF excitation field using said first transmission mode to excite said nuclear spins in said excitation region with a first spatial dependency, and operating said magnetic resonance data acquisition unit to produce said second RF excitation field using said second transmission mode to excite nuclear spins in the excitation region with a second spatial dependency that differs from said first spatial dependency.

6. A method as claimed in claim 1 comprising operating said magnetic resonance data acquisition unit in each of said first and second RF transmission modes according to a multichannel transmission method selected from the group consisting of RF shimming and Transmit SENSE.

7. A method as claimed in claim 1 wherein said magnetic resonance data acquisition unit comprises at least two transmission units that each radiate RF excitation signals, and supplying respective transmission signals to said at least two transmission units using said first RF transmission mode that differ from transmission signals respectively supplied to said at least two transmission units using said second RF transmission mode.

8. A method as claimed in claim 1 comprising producing either said first RF excitation field or second RF excitation field with a substantially circularly polarized field distribution.

9. A method as claimed in claim 1 wherein said magnetic resonance data acquisition unit comprises a plurality of transmission units, including adjacent transmission units, and, in one of said first and second transmission modes, activating said adjacent transmission units with transmission signals having a phase difference corresponding to 360° divided by the number of said transmission units.

10. A method as claimed in claim 1 wherein said magnetic resonance data acquisition unit comprises a plurality of transmission units, including adjacent transmission units, and, in one of said first and second transmission modes, activating said adjacent transmission units with transmission signals having a phase difference corresponding to a multiple of 360° divided by the number of said transmission units.

11. A method as claimed in claim 1 comprising, in said computerized processor, processing said first and second magnetic resonance response signals jointly to reconstruct said common magnetic resonance image.

12. A method as claimed in claim 1 comprising, in said computerized processor, Fourier transforming each of said first and second magnetic resonance response signals to reconstruct said common magnetic resonance image.

13. A method as claimed in claim 1 comprising, in said computerized processor, employing a partial parallel acquisition algorithm to reconstruct said common magnetic resonance image using said first and second magnetic resonance response signals.

14. A method as claimed in claim 1 comprising phase coding said nuclear spins in said excitation region before measuring said first magnetic resonance response signal by operating said magnetic resonance data acquisition unit to generate a gradient magnetic field.

15. A method as claimed in claim 14 comprising also phase coding said second magnetic resonance response signal.

16. A method as claimed in claim 1 comprising, in said computerized processor, reconstructing said common magnetic resonance image by implementing a partial parallel acquisition algorithm that acts on respective signals received from different acquisition channels, and using said first and second magnetic resonance response signals respectively as said signals for said different acquisition channels in said partial parallel acquisition algorithm.

17. A computerized evaluation device for a magnetic resonance tomography apparatus, said magnetic resonance tomography apparatus comprising a magnetic resonance data acquisition unit that receives an examination subject therein, said computerized evaluation device comprising:
 a memory organized as k-space comprising a plurality of data storage lines, with a first set of said lines containing first magnetic resonance data representing a first magnetic resonance response signal obtained by operating said magnetic resonance data acquisition unit, in which a subject is located, to excite nuclear spins in an excitation region of said subject by radiating a first RF excitation field in said data acquisition unit using a first RF transmission mode that causes said first magnetic resonance response signal to be emitted from said nuclear spins in said excitation region;
 said memory also comprising a second set of said lines that contain second magnetic resonance data representing a second magnetic resonance response signal obtained by operating said magnetic resonance data acquisition unit to excite said nuclear spins in said excitation region of said subject by radiating a second RF excitation field in said data acquisition unit interleaved in time with radiating said first RF excitation field, using a second RF transmission mode, said second RF excitation field differing from and not being superimposed with said first RF excitation field, and said second RF transmission mode not being an identical repetition of said first RF transmission mode, to produce a that causes said second magnetic resonance response signal from said nuclear spins in said excitation region interleaved in time with said first magnetic resonance signal;
 said first set of said lines and said second set of said lines being interleaved with each other in said memory, thereby producing interleaved first and second magnetic resonance data in said memory; and
a computerized processor configured to reconstruct a common magnetic resonance image from said first and second magnetic resonance response signals, and to make a data file comprising said common magnetic resonance image available in electronic form at an output of said computerized processor.

18. A magnetic resonance tomography apparatus comprising:
 a magnetic resonance data acquisition unit that receives an examination subject therein;
 a memory organized as k-space comprising a plurality of data storage lines therein;
 a computerized control and evaluation system configured to operate said magnetic resonance data acquisition unit, in which a subject is located, to excite nuclear spins in an excitation region of said subject by radiating a first RF excitation field in said data acquisition unit using a first RF transmission mode that causes a first magnetic resonance response signal to be emitted from said nuclear spins in said excitation region, and to detect said first magnetic resonance response signal as detected first magnetic resonance data;
 said control and evaluation system configured to operate said magnetic resonance data acquisition unit to excite said nuclear spins in said excitation region of said subject by radiating a second RF excitation field in said data acquisition unit interleaved in time with radiating said first excitation field, using a second RF transmission mode, said second RF excitation field differing from and not being superimposed with said first RF excitation field, and said second RF transmission mode not being an identical repetition of said first RF transmission mode, that causes a second magnetic resonance response signal from said nuclear spins in said excitation region interleaved in time with said first magnetic resonance signal, and to detect said second magnetic resonance signal as detected second magnetic resonance data;
 said control and evaluation system being configured to enter said first magnetic resonance data into a first set of said lines in said memory and to enter said second magnetic resonance data into a second set of said lines in said memory, with said first and second sets of said lines being interleaved with each other in said memory, thereby producing interleaved first and second magnetic resonance data in said memory; and said control and evaluation system comprising a processor configured to access the interleaved first and second magnetic resonance data from said memory, and said processor being configured to reconstruct a common, single magnetic resonance image from said interleaved first and second magnetic resonance data, and to make a data file comprising said common, single magnetic resonance image available in electronic form at an output of said processor.

19. A method as claimed in claim 1 comprising operating said magnetic resonance data acquisition unit to repeatedly excite said nuclear spins using said first transmission mode and to repeatedly excite said nuclear spins with said second transmission mode, with a plurality of repetitions of excitation using said first transmission mode being interleaved in time, by alternating therewith, with a plurality of repetitions of excitation of said nuclear spins with said second transmission mode.

20. A magnetic resonance tomography apparatus as claimed in claim 18 wherein said computerized control and evaluation system is configured to operate said magnetic resonance data acquisition unit to repeatedly excite said nuclear spins using said first transmission mode and to repeatedly excite said nuclear spins using said second transmission mode, with a plurality of repetitions of excitation using said first transmission mode being interleaved, by alternating therewith, with a plurality of repetitions of excitation of said nuclear spins using said second transmission mode.

* * * * *